(12) United States Patent
Bryant

(10) Patent No.: US 12,345,754 B2
(45) Date of Patent: Jul. 1, 2025

(54) ANALYZING AN OPERATION OF A POWER SEMICONDUCTOR DEVICE

(71) Applicant: Maschinenfabrik Reinhausen GmbH, Regensburg (DE)

(72) Inventor: Angus Bryant, Cambridge (GB)

(73) Assignee: MASCHINENFABRIK REINHAUSEN GMBH, Regensburg (DE)

(*) Notice: Subject to any disclaimer, the term of this patent is extended or adjusted under 35 U.S.C. 154(b) by 278 days.

(21) Appl. No.: 17/802,969

(22) PCT Filed: Feb. 12, 2021

(86) PCT No.: PCT/EP2021/053440
§ 371 (c)(1),
(2) Date: Aug. 29, 2022

(87) PCT Pub. No.: WO2021/175564
PCT Pub. Date: Sep. 10, 2021

(65) Prior Publication Data
US 2023/0096094 A1    Mar. 30, 2023

(30) Foreign Application Priority Data
Mar. 2, 2020 (EP) ..................... 20160411

(51) Int. Cl.
*G01R 31/26* (2020.01)

(52) U.S. Cl.
CPC ..... *G01R 31/2642* (2013.01); *G01R 31/2603* (2013.01); *G01R 31/2619* (2013.01); *G01R 31/2628* (2013.01); *G01R 31/263* (2013.01)

(58) Field of Classification Search
None
See application file for complete search history.

(56) References Cited

U.S. PATENT DOCUMENTS 6,297,661 B1  10/2001  Chen et al.
7,577,536 B1 *  8/2009  Chisholm ......... H01M 8/04559
                                                            702/65
(Continued)

FOREIGN PATENT DOCUMENTS

CN   106124957 A   11/2016
CN   109143015 A    1/2019
(Continued)

OTHER PUBLICATIONS

Yang Yanyong et al., "A Novel On-line IGBT Junction Temperature Measurement Method Based on On-state Voltage Drop," 2019 22nd International Conference on Electrical Machines and Systems (ICEMS), Aug. 2019, p. 1-6, IEEE, Harbin, China.
(Continued)

*Primary Examiner* — Jermele M Hollington
(74) *Attorney, Agent, or Firm* — LEYDIG, VOIT & MAYER, LTD.

(57) ABSTRACT

A method analyzes an operation of a power semiconductor device. The method includes: providing a set of reference voltages of the device and a set of corresponding reference currents; measuring, within a predetermined time-interval, Nframe on-state voltages and Nframe corresponding on-state currents of the device to obtain Nframe measurement points, Nframe being an integer number equal to or greater than 2; adapting the set of reference voltages by carrying out a least squares fit to the Nframe measurement points; and using the adapted set of reference voltages to analyze the operation of the power semiconductor device.

14 Claims, 5 Drawing Sheets

(56) References Cited

U.S. PATENT DOCUMENTS

| | | | | |
|---|---|---|---|---|
| 9,529,037 B2* | 12/2016 | Thøgersen | ......... | G01R 31/2642 |
| 11,262,248 B2* | 3/2022 | Bryant | ................. | G01R 31/263 |
| 11,735,993 B2* | 8/2023 | Bryant | ................... | G01R 31/42 |
| | | | | 323/282 |

FOREIGN PATENT DOCUMENTS

| | | |
|---|---|---|
| DE | 102018110291 A1 | 10/2019 |
| JP | S616835 A | 1/1986 |
| JP | S63106577 A | 5/1988 |
| JP | 2009168559 A | 7/2009 |

OTHER PUBLICATIONS

Baker Nick et al., "Online junction temperature measurement using peak gate current," 2015 IEEE Applied Power Electronics Conference and Exposition (APEC), Mar. 2015, p. 1270-1275, IEEE, Charlotte, NC, USA.

Sathik Mohamed Halick Mohamed et al., "Comparison of IGBT junction temperature measurement and estimation methods—a review," 2017 Asian Conference on Energy, Power and Transportation Electrification (ACEPT), Oct. 2017, p. 1-8, IEEE, Singapore.

Eleffendi Mohd Amir et al., "Application of Kalman Filter to Estimate Junction Temperature in IGBT Power Modules," IEEE Transactions on Power Electronics, Feb. 2016, p. 1576-1587, vol. 31, Issue 2, IEEE, Piscataway, NJ, USA.

\* cited by examiner

| $I_{meas}$ (pu) | $w_1$ | $w_2$ | $w_3$ | $w_4$ | $w_5$ | $w_6$ | $w_7$ | $w_8$ | $w_9$ |
|---|---|---|---|---|---|---|---|---|---|
| 0 | 0 | 0 | 0 | 0 | 0 | 0 | 0 | 0 | 0 |
| 0.05 | 0 | 0 | 0 | 0 | 0 | 0 | 0 | 0 | 0 |
| 0.1 | 1 | 0 | 0 | 0 | 0 | 0 | 0 | 0 | 0 |
| 0.15 | 0.5 | 0.5 | 0 | 0 | 0 | 0 | 0 | 0 | 0 |
| 0.2 | 0 | 1 | 0 | 0 | 0 | 0 | 0 | 0 | 0 |
| 0.25 | 0 | 0.5 | 0.5 | 0 | 0 | 0 | 0 | 0 | 0 |
| 0.3 | 0 | 0 | 1 | 0 | 0 | 0 | 0 | 0 | 0 |
| 0.35 | 0 | 0 | 0.5 | 0.5 | 0 | 0 | 0 | 0 | 0 |
| 0.4 | 0 | 0 | 0 | 1 | 0 | 0 | 0 | 0 | 0 |
| 0.45 | 0 | 0 | 0 | 0.5 | 0.5 | 0 | 0 | 0 | 0 |
| 0.5 | 0 | 0 | 0 | 0 | 1 | 0 | 0 | 0 | 0 |
| 0.55 | 0 | 0 | 0 | 0 | 0.5 | 0.5 | 0 | 0 | 0 |
| 0.6 | 0 | 0 | 0 | 0 | 0 | 1 | 0 | 0 | 0 |
| 0.65 | 0 | 0 | 0 | 0 | 0 | 0.5 | 0.5 | 0 | 0 |
| 0.7 | 0 | 0 | 0 | 0 | 0 | 0 | 1 | 0 | 0 |
| 0.75 | 0 | 0 | 0 | 0 | 0 | 0 | 0.5 | 0.5 | 0 |
| 0.8 | 0 | 0 | 0 | 0 | 0 | 0 | 0 | 1 | 0 |
| 0.85 | 0 | 0 | 0 | 0 | 0 | 0 | 0 | 0.5 | 0.5 |
| 0.9 | 0 | 0 | 0 | 0 | 0 | 0 | 0 | 0 | 1 |
| 0.95 | 0 | 0 | 0 | 0 | 0 | 0 | 0 | 0 | 0 |
| 1.0 | 0 | 0 | 0 | 0 | 0 | 0 | 0 | 0 | 0 |

ANALYZING AN OPERATION OF A POWER SEMICONDUCTOR DEVICE

CROSS REFERENCE TO RELATED APPLICATIONS

This application is a U.S. National Phase application under 35 U.S.C. § 371 of International Application No. PCT/EP2021/053440 filed on Feb. 12, 2021, and claims benefit to European Patent Application No. EP 20160411.3, filed on Mar. 2, 2020. The International Application was published in English on Sep. 10, 2021 as WO 2021/175564 A1 under PCT Article 21(2).

FIELD

The present disclosure relates to a method and a circuit for analyzing an operation of a power semiconductor device and to a power electronic system comprising such circuit.

BACKGROUND

In power electronic systems, for example power converters, the junction temperature of power semiconductor devices is a critical quantity setting a limit on system operation. Exceeding an absolute limit may be regarded as catastrophic and thermal behavior throughout the lifetime of the system affects reliability and rate of degradation. However, the devices themselves, for example insulated gate bipolar transistors, IGBTs, MOSFETs, thyristors or diodes are electrically "live" and in an electrically highly noisy environment, so direct measurement of the junction temperature may be not feasible.

The junction temperature may, however, be estimated based on temperature-sensitive electrical parameters, TSEPs, associated with the semiconductor device. Existing approaches have estimated the junction temperature from TSEPs at very low currents, namely in the milliamp regime, which is typically less than 1% of the rated current of a power electronic system. Therefore, such method is not applicable to the majority of applications of power electronic systems and may be useful only in specific lab setups. Other approaches have estimated the junction temperature at high current, for example 10 to 100% of the rated current. In this case, a look-up table or equation may be fitted to prior calibration data measured across a range of junction temperatures and on-state (i.e. forward) currents. However, this requires a detailed and accurate calibration of each system prior to use, which is impractical for industrial applications.

SUMMARY

In an embodiment, the present disclosure provides a method that analyzes an operation of a power semiconductor device. The method includes: providing a set of reference voltages of the device and a set of corresponding reference currents; measuring, within a predetermined time-interval, Nframe on-state voltages and Nframe corresponding on-state currents of the device to obtain Nframe measurement points, Nframe being an integer number equal to or greater than 2; adapting the set of reference voltages by carrying out a least squares fit to the Nframe measurement points; and using the adapted set of reference voltages to analyze the operation of the power semiconductor device.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1A:
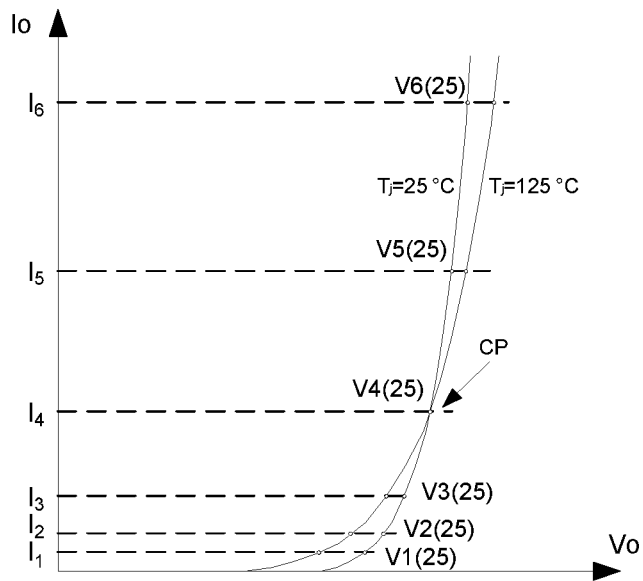
FIG. 1A shows on-state current versus on-state voltage of a power semiconductor device at two different junction temperatures.

Aspects of the present disclosure provide improved concepts for analyzing an operation of a power semiconductor device that are applicable at on-state currents at least up to the rated current and does not require a prior calibration.

Aspects of the present disclosure are based on the idea to utilize an on-state voltage of the power semiconductor device as TSEP and to effectively remove the dependency of the on-state voltage on the on-state current, leaving just a dependency on junction temperature. This is achieved by assigning measurement points to predefined bins and correcting the bins by carrying out a least squares fit to the visited measurement points. This results in an effective online calibration, that is carried out during normal operation, which makes an actual calibration prior to usage obsolete.

According to the present disclosure, a method for analyzing an operation of a power semiconductor device is provided. A set of N reference voltages of the device and a set of N corresponding reference currents of the device are provided. N is an integer number equal to or greater than 2. Nframe on-state voltages and an on-state currents of the device are measured within a predetermined time-interval, the measured voltages and currents representing Nframe measurement points. Nframe is an integer number equal to or greater than 2. The set of reference voltages is adapted by carrying out a least squares fit to the Nframe measurement points, in particular, to the Nframe measured on-state voltages at the measurement points. Principally, any least squares method can be used for the fit, while an incremental least squares method is preferred. Then, the adapted set of reference voltages is used to analyze the operation of the power semiconductor device.

The method according to the present disclosure is well applicable at on-state currents at least up to the rated current and a prior calibration can be avoided. It provides an advantageous trade-off of accuracy and computational load. Due to a large set of data being used, the error can be greatly reduced. The method can cope with DC currents or very low frequency AC currents, which many known approaches cannot.

According to some implementations of the method, the analysis of the operation of the power semiconductor device comprises estimating a junction temperature of the device based on the adapted set of reference voltages.

According to some implementations, the analysis of the operation of the power semiconductor device comprises determining a shift in the on-state voltage over time.

The shift of the on-state voltage represents an electrical degradation of the power semiconductor device. These implementations are in particular suitable in case there exists a temperature-invariant point in a current-voltage characteristic of the power semiconductor device and one of the reference currents corresponds to the invariant point.

According to some implementations, for the least squares fit a piecewise-linear approximation between each two adjacent measurement points, in particular, between each two adjacent measured on-state currents at the measurement points, is assumed. Compared to other approaches where a continuous voltage-current approximation is assumed, by the present incremental, piecewise-linear approximation the error can be reduced to a minimum while maintaining low computational complexity.

According to some implementations, the least squares fit comprises defining a validity factor for each reference current, wherein the validity factors represent how near a measured on-state current in the current domain is to each of the reference currents. Generally, the proximity of the measurement points to the respective reference currents and associated reference voltages, as represented by the validity factors, gives an indication how valid or accurate a certain measurement point, in particular a certain measured on-state current, is with respect to a certain reference current. The validity factors therefore represent weighting factors that can be used for weighting the measured on-state voltages according to their respective validities or accuracies. Defining the validity factors might include e.g. providing one or more equations for calculating the validity factors, providing a diagram or a look-up table for reading the validity factors.

The least squares fit preferably further comprises determining a set of validity factors for each measurement point, in particular for each measured on-state current, resulting in Nframe sets of validity factors. Determining the set of validity factors might include e.g. calculating the validity factors with one or more equations, taking the validity factors from a diagram or a look-up table.

According to some implementations, for a measurement point within the predetermined time interval, the validity factors are defined in such a way that a validity factor associated with a certain reference current equals 1 when the measured on-state current of the associated measurement point equals the said reference current, while the validity factor associated with the said reference current equals 0 when the measured on-state current of the associated measurement point equals an adjacent reference current. Preferably, when the measured on-state current of the associated measurement point lies between the reference current and the adjacent reference current a validity factor associated with a certain reference current is a value between 1 and 0. Preferably, the validity factor decreases in a linear manner from the visited reference current to the adjacent reference current.

According to some implementations, for a measurement point within the predefined time-interval the validity factors are defined, i.e. can be calculated, by the following set of equations:

$$w_1(k) = 1 - \frac{I_{meas}(k) - I_1}{I_2 - I_1} \text{ for } I_1 \le I_{meas}(k) \le I_2, \text{ and} \quad (1)$$

$$w_1(k) = 0 \text{ for } I_{meas}(k) < I_1 \text{ and } I_{meas}(k) > I_2; \quad (2)$$

$$\ldots$$

$$w_n(k) = \frac{I_{meas}(k) - I_{n-1}}{I_n - I_{n-1}} \text{ for } I_{n-1} \le I_{meas}(k) \le I_n, \quad (3)$$

$$w_n(k) = 1 - \frac{I_{meas}(k) - I_n}{I_{n+1} - I_n} \text{ for } I_n \le I_{meas}(k) \le I_{n+1}, \text{ and} \quad (4)$$

$$w_n(k) = 0 \text{ for } I_{meas}(k) < I_{n-1} \text{ and } I_{meas}(k) > I_{n+1}; \quad (5)$$

$$\ldots$$

$$w_N(k) = \frac{I_{meas}(k) - I_{N-1}}{I_N - I_{N-1}} \text{ for } I_{N-1} \le I_{meas}(k) \le I_N, \text{ and} \quad (6)$$

$$w_N(k) = 0 \text{ for } I_{meas}(k) < I_{N-1} \text{ and } I_{meas}(k) > I_N. \quad (7)$$

According to some implementations, the adapted set of reference voltages is determined, in particular calculated, based on the determined validity factors and the measured on-state voltages. In particular, the adapted set of reference voltages is calculated by solving a linear system of equations, preferably including a vector of the N adapted reference voltages, a vector of the Nframe measured on-stage voltages, and a matrix including or calculated from the validity factors.

According to some implementations, the adapted set of reference voltages is or can be calculated by solving the equation $$\begin{bmatrix} V_{meas}(1) \\ \vdots \\ V_{meas}(N_{frame}) \end{bmatrix} = \begin{bmatrix} w_1(1) & \cdots & w_N(1) \\ \vdots & \ddots & \vdots \\ w_1(N_{frame}) & \cdots & w_N(N_{frame}) \end{bmatrix} \begin{bmatrix} V_1 \\ \vdots \\ V_N \end{bmatrix}, \text{ i.e.:} \quad (8)$$

$$\underline{V}_{meas} = W\underline{V}, \quad (9)$$

for the vector $\underline{V}$, where $\underline{V}_{meas}$ is the vector of the measured on-stage voltages in the time-interval, W is the matrix array of validity factors for each reference voltage at each measurement point in the time-interval, derived from the measured on-state current at each measurement point, and $\underline{V}$ is the vector of reference voltages being fitted in the present time-interval. Each row of $\underline{V}_{meas}$ and W corresponds to a different measurement point. This represents an example of a least squares fit, with known $\underline{V}_{meas}$ and W and unknown $\underline{V}$. Any least squares approach can be used to calculate $\underline{V}$ for each time-interval, e.g. using the pseudo-inverse, QR factorisation, etc.

According to some implementations, calculation of the adapted set of reference voltages can either proceed by (a) logging all $N_{frame}$ measurement points during the time-interval and then performing all the least squares matrix calculations at the end of the time-interval, or (b) calculating intermediate matrices at every measurement point and then performing the final matrix calculations at the end of the time-interval (incremental approach).

According to some implementations, the step of estimating the junction temperature comprises determining a set of average validity factors based on the Nframe sets of validity factors and estimating the junction temperature based on the set of average validity factors.

According to some implementations, the determination of the set of average validity factors comprises determining respective time averages over corresponding validity factors of the Nframe sets of validity factors. Preferably, the set of average validity factors can be calculated with the following equation:

$$w_{n(av)} = \frac{1}{N_{frame}} \sum_{k=1}^{N_{frame}} w_n(k). \quad (10)$$

The average validity factor $w_{n(av)}$ corresponding to a particular reference voltage $V_n$ in a time-interval effectively provides an indication of the confidence in the accuracy of the reference voltage estimate. This may be used by a calibration algorithm to determine how to use the reference voltages in the identification of electrical and thermal characteristics.

According to some implementations, the step of estimating the junction temperature comprises calculating an estimated value for the junction temperature based on an assumed linear relationship between the estimated value for the junction temperature and one of the adapted set of reference voltages.

According to some implementations, the step of estimating the junction temperature comprises calculating a plurality of estimated values for the junction temperature based on respective assumed linear relationships between each estimated value for the junction temperature and a respective one of the adapted set of reference voltages. Each of the plurality of estimated junction temperatures is weighted according to a respective average validity of the set of average validities. The weighted estimated values for the junction temperature may then be added up and for example normalized to obtain a final estimate for the junction temperature.

According to an aspect of the present disclosure, also a circuit for analyzing an operation of a power semiconductor device is provided. The circuit comprises a measuring unit, a storage unit and an evaluation unit. The measuring unit is configured to measure within a predetermined time-interval Nframe on-state voltages and Nframe corresponding on-state currents of the device to obtain Nframe measurement points, wherein Nframe is an integer number equal to or greater than 2. The storage unit is configured to store a set of reference voltages of the device and a set of corresponding reference currents of the device. The storage unit might also be configured to store a look-up table, a diagram, or an algorithm, to determine validity factors.

The evaluation unit is configured to adapt the set of reference voltages by carrying out a least squares fit to the Nframe measurement points, in particular to the Nframe measured on-state voltages at the measurement points. The evaluation unit is further configured to analyze the operation of the power semiconductor device based on the adapted set of reference voltages.

According to another aspect of the present disclosure, also a power electronic system is provided. The power electronics system comprises a circuit according to the present disclosure and the power semiconductor device.

According to some implementations, the power semiconductor device comprises a diode, in particular a PIN diode or a Schottky diode or a thyristor or a field effect transistor, for example a MOSFET, a JFET or an HEMT, or a bipolar transistor, for example an IGBT or a BJT.

According to some implementations of the power electronic system, the power electronic system comprises a power converter. The power converter comprises the power semiconductor device.

Further implementations of the circuit according to aspects of the present disclosure follow readily from the various implementations of the method according to the present disclosure and vice versa. Further implementations of the power electronic system according to the present disclosure follow readily from the various implementations of the method according to the present disclosure and vice versa.

FIG. 1A shows exemplary curves of on-state current Io versus on-state voltage Vo of a power semiconductor device at a junction temperature Tj of 25° C. and of 125° C. two different junction temperatures. The curves cross at a crossing point CP. A discrete set of six currents I1, I2, . . . , I6 and corresponding voltages V1(25), V2(25), . . . , V6(25) at Tj=25° C. are marked. Of course, the number of six currents is an arbitrary example and could be any number equal to or greater than 2.

Figure 1B:
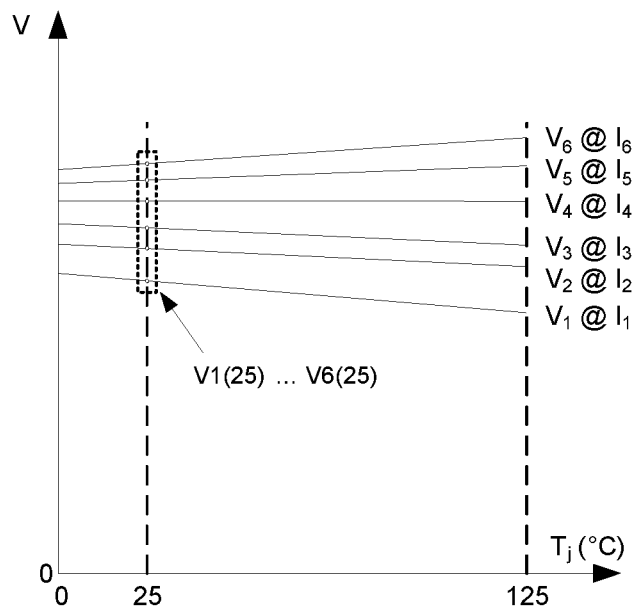
FIG. 1B shows on-state voltage versus junction temperature of a power semiconductor device at different on-state currents.

FIG. 1B shows a Tj-dependence of the voltages V1(25), . . . , V6(25). One can see, that voltages below the crossing point CP show a negative temperature coefficient, that is decrease with increasing Tj for fixed current, while the voltages above the crossing point CP show a positive temperature coefficient, that is increase with increasing Tj for fixed current.

The crossing point CP does not show a Tj-dependence. For some power semiconductor devices, for example some PIN diodes, the crossing point CP may be close to or above the rated current. For other power semiconductor devices, for example insulated-gate bipolar transistors, IGBTs, the crossing point may be below 10% of the rated current. Still other power semiconductor devices may have no single crossing point CP, for example due to non-linear temperature dependence of the on-state voltage.

Due to the described temperature dependence, an analysis of an operation of a power semiconductor device based on the forward voltage is complicated. According to the present disclosure, nevertheless a meaningful analysis can be carried out without prior calibration and without significant restrictions to the applicable current range, as described above and in the following.

Exemplary implementations of a method according to an aspect of the present disclosure are now explained with respect to FIGS. 2 to 5.

Figure 2:
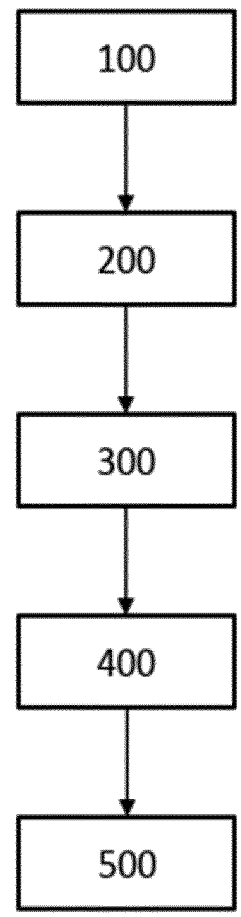
FIG. 2 shows a flow diagram of a further exemplary implementation of a method according to the present disclosure.

In step 100 of FIG. 2, a set of reference voltages Vn, Vn+1, . . . VN, in particular reference on-state voltages, of a power semiconductor device and a set of corresponding reference currents In, In+1, . . . IN, in particular reference on-state currents, of the device are determined. For example, the reference voltages and currents may be predefined nominal quantities, for example defined in the datasheet, of the power semiconductor device at a predefined junction temperature or they may be predetermined quantities measured at a defined junction temperature.

In step 200, within a predetermined time-interval, Nframe on-state voltages Vmeas(1), . . . Vmeas(k), . . . Vmeas (Nframe) and Nframe corresponding on-state currents Imeas (1), . . . Imeas(k), . . . Imeas(Nframe) of the device are measured, representing Nframe measurement points MP(1), . . . MP(k), . . . MP(Nframe). Nframe is an integer number equal to or greater than 2, while k is a certain repetition of the on-state voltage and current measurement resulting in the associated measurement point MP(k).

Figure 3:
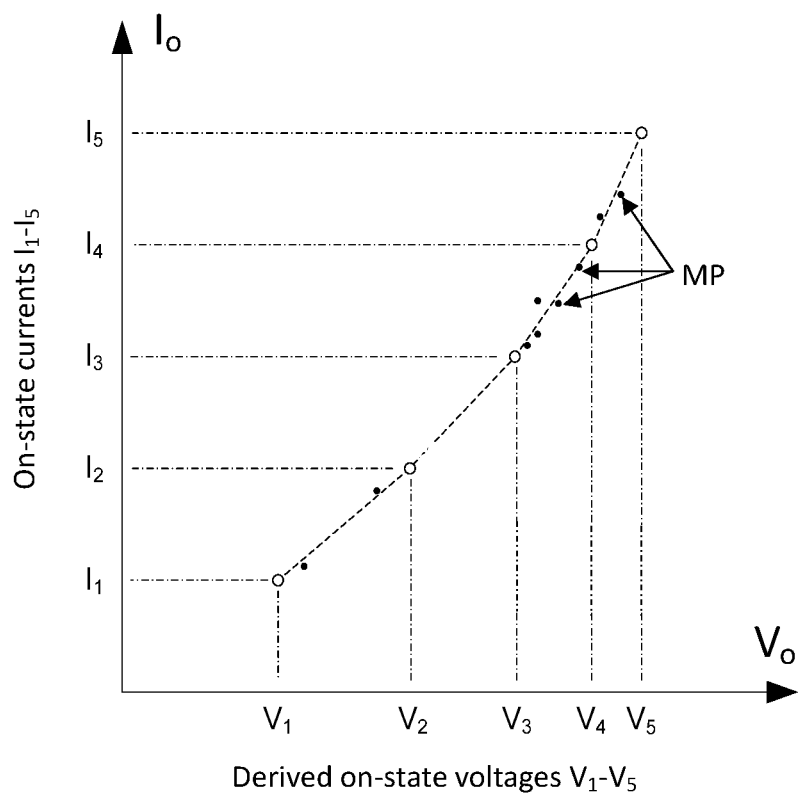
FIG. 3 shows an I-V-diagram representing parts of an exemplary implementation of a method according to the present disclosure.

FIG. 3 exemplarily shows several measurement points MP as well as five reference voltages V1 to V5 and corresponding reference currents I1 to I5. The reference currents I1 to I5 are equally spaced from one another, and the reference voltages V1 to v5 are the voltages corresponding to the reference currents I1 to I5. FIG. 3 also shows a piece-wise linear approximated I-V curve between each two adjacent reference currents I1 to I5 and associated reference voltages V1 to V5.

In step 300, the set of reference voltages V1, . . . Vn, . . . VN is adapted by carrying out a least squares fit to the Nframe measured on-state voltages Vmeas(1), . . . Vmeas(k), . . . Vmeas(Nframe) at the measurement points MP(1), . . . MP(k), . . . MP(Nframe). The least squares fit is based on the assumption of a piecewise-linear approximation between each two adjacent measured on-state currents Imeas(1), . . . Imeas(k), . . . Imeas(Nframe at the measurement points) MP(1), . . . MP(k), . . . MP(Nframe), as shown in FIG. 3.

The least squares fit requires a definition of a validity factor W1, . . . Wn, . . . WN for each reference current I1, . . . In, . . . IN. The validity factors W1, . . . Wn, . . . WN represent how near a measured on-state current Imeas(1), . . . Imeas(k), . . . Imeas(Nframe) in the current domain is to each of the reference currents I1, . . . In, . . . IN and therefore represent how valid the measured on-state current Imeas(1), . . . Imeas(k), . . . Imeas(Nframe) is with respect to any of the reference currents I1, . . . In, . . . IN.

The validity factors W1(k), . . . Wn(k), . . . WN(k) for a measurement point MP(k) within the predetermined time-interval are defined in such a way that a validity factor W1(k), . . . Wn(k), . . . WN(k) associated with a certain reference current I1, . . . In, . . . IN equals 1 when the measured on-state current Imeas(k) of the associated measurement point MP(k) equals the said reference current (I1, . . . In, . . . IN), while the validity factor W1(k), . . . Wn(k), . . . WN(k) associated with the said reference current I1, . . . In, . . . IN equals 0 when the measured on-state current Imeas(k) of the associated measurement point MP(k) equals an adjacent reference current I2, . . . In+1, . . . IN−1. In between the reference currents I1, . . . In, . . . IN, the validity factor W1(k), . . . Wn(k), . . . WN(k) decreases in a linear manner from the visited reference current I1, . . . In, . . . IN to the adjacent reference current I2, . . . In+1, . . . IN−1.

This definition can be noted e.g. in the following set of equations:

$$w_1(k) = 1 - \frac{I_{meas}(k) - I_1}{I_2 - I_1} \quad \text{for} \quad I_1 \leq I_{meas}(k) \leq I_2, \text{ and} \tag{1}$$

$$w_1(k) = 0 \quad \text{for} \quad I_{meas}(k) < I_1 \text{ and } I_{meas}(k) > I_2; \tag{2}$$

...

$$w_n(k) = \frac{I_{meas}(k) - I_{n-1}}{I_n - I_{n-1}} \quad \text{for} \quad I_{n-1} \leq I_{meas}(k) \leq I_n, \tag{3}$$

$$w_n(k) = 1 - \frac{I_{meas}(k) - I_n}{I_{n+1} - I_n} \quad \text{for} \quad I_n \leq I_{meas}(k) \leq I_{n+1}, \text{ and} \tag{4}$$

$$w_n(k) = 0 \quad \text{for} \quad I_{meas}(k) < I_{n-1} \text{ and } I_{meas}(k) > I_{n+1}; \tag{5}$$

...

$$w_N(k) = \frac{I_{meas}(k) - I_{N-1}}{I_N - I_{N-1}} \quad \text{for} \quad I_{N-1} \leq I_{meas}(k) \leq I_N, \text{ and} \tag{6}$$

$$w_N(k) = 0 \quad \text{for} \quad I_{meas}(k) < I_{N-1} \text{ and } I_{meas}(k) > I_N. \tag{7}$$

Figures 4, 5:
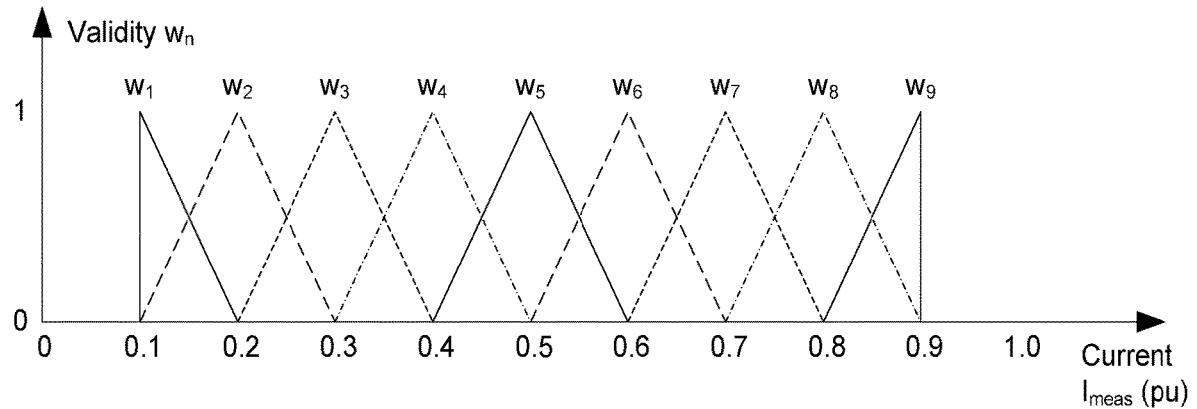
FIG. 4 shows a diagram representing validity factors W1-W9 associated with exemplary reference currents I1-I9 in dependence of a measured on-state current Imeas.
FIG. 5 shows a look-up table including values for validity factors W1-W9 associated with reference currents I1-I9 in dependence of a measured on-state current Imeas.
Figure 6:
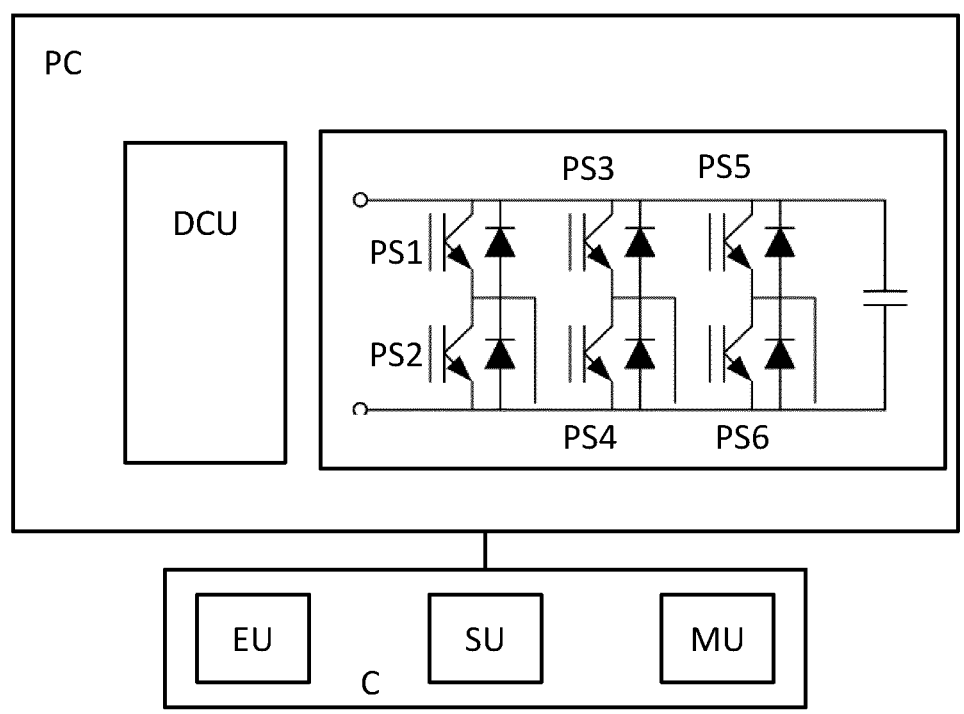
FIG. 6 shows a block diagram of an exemplary implementation of a power electronic system according to the present disclosure.

Alternatively, the definition of the validity factors W1, . . . Wn, . . . WN can be noted by way of a diagram, as shown in FIG. 4, or by way of a look-up table, as shown in FIG. 5. In FIGS. 5 and 6, by way of example nine validity factors W1 to W9 are presented associated with nine reference currents I1 to I9, in dependence of the measured on-state current Imeas of a specific measurement point MP, wherein the measured on-state current is noted in unity pu, i.e. relative to the rated current (1.0 pu means measured on-state current equals rated current). For example, if a measured on-state current was equal to 0.37 pu, then all Wn=0 except for W3=0.3 and W4=0.7. Note that currents less than 0.1 pu and greater than 0.9 pu are ignored in this example.

Using any of the afore-described definitions, a set of validity factors W1, . . . Wn, . . . WN for each measurement point MP(1), . . . MP(k), . . . MP(Nframe), in particular for each measured on-state current Imeas(1), . . . Imeas(k), . . . Imeas(Nframe), is determined, i.e. calculated with the equations or read from the diagram or table, resulting in Nframe sets of validity factors W1(1), . . . Wn(k), . . . WN(Nframe).

The adapted set of reference voltages V1, . . . Vn, . . . VN is then determined based on the determined validity factors W1(1), . . . Wn(k), . . . WN(Nframe) and the measured on-state voltages Vmeas(1), . . . Vmeas(k), . . . Vmeas (Nframe). In particular, the adapted set of reference voltages (V1, . . . Vn, . . . VN) is calculated by solving the equation $$\begin{bmatrix} V_{meas}(1) \\ \vdots \\ V_{meas}(N_{frame}) \end{bmatrix} = \begin{bmatrix} w_1(1) & \cdots & w_N(1) \\ \vdots & \ddots & \vdots \\ w_1(N_{frame}) & \cdots & w_N(N_{frame}) \end{bmatrix} \begin{bmatrix} V_1 \\ \vdots \\ V_N \end{bmatrix}, \text{i.e.:} \tag{8}$$

$$\underline{V}_{meas} = W\underline{V}, \tag{9}$$

for the vector $\underline{V}$, wherein $\underline{V}_{meas}$ is the vector of the measured on-stage voltages in the time-interval, W is the matrix of validity factors for each reference voltage at each measurement point in the time-interval, derived from the measured on-state current at each measurement point, and $\underline{V}$ is the vector of reference voltages being fitted in the present time-interval. Solving of this equation for vector $\underline{V}$ can be done by various common approaches, such as the pseudo-inverse or QR factorisation.

The adapted reference voltages V1, . . . Vn, . . . VN can be used as current independent estimates for the measured on-state voltage Vmeas.

In step 400, at the end of the time-interval, an average validity factor Wn(av) may be calculated for each voltage Vn of the adapted sets of reference voltages V1, . . . Vn, . . . VN according to the formula $$w_{n(av)} = \frac{1}{N_{frame}} \sum_{k=1}^{N_{frame}} w_n(k), \tag{10}$$

resulting in a set of average validity factors W1(av), . . . Wn(av), . . . WN(av).

The average validity factor Wn(av) for a particular adapted reference voltage Vn provides an indication of a confidence in the accuracy of the voltage estimate.

A duration of the sample time interval may for example be selected as a compromise between a long duration to achieve improved averaging and a short duration so that the assumption of approximately constant junction temperature Tj throughout the time-interval is valid.

In step 500, the adapted set of reference voltages V1, . . . Vn, . . . VN is used to analyze the operation of the power semiconductor device.

In particular, the analysis may involve selecting the reference voltage Vn from the adapted set of reference voltages V1, . . . Vn, . . . VN with the greatest average validity factor Wn(av) and calculating an estimated value for the junction temperature Tj based on an assumed linear relationship between the junction temperature Tj and the selected reference voltage Vn.

For example, the analysis may involve calculating a respective estimated value for the junction temperature based on said assumed linear relationship for several or all of the reference voltages Vn of the adapted set of reference voltages V1, . . . Vn, . . . VN. Then, a weighted average of the estimated value for the junction temperature Tj may be determined. The weighting may be performed according to the respective average validity factors W1(*av*), . . . Wn(av), . . . WN(av).

FIG. 6 shows a block diagram of an exemplary implementation of a power electronic system according to an aspect of the present disclosure. In particular, the power electronics system is configured to perform a method according to the present disclosure as described with respect to FIGS. 2 to 5.

The system comprises a circuit C according to an aspect of the present disclosure and a power electronics device, for example a power converter PC, coupled to the circuit C. The power converter PC comprises one or more power semiconductor devices PS1, PS2, . . . , PS6, for example IGBTs. The number of power semiconductor devices being equal to six in FIG. 6 serves merely for illustratory reasons and can differ from six. In the example of FIG. 6, the devices PS1, . . . , PS6 are depicted as part of a six-switch three-phase two-level inverter which is a standard application for a power converter. However, this is done only for illustration, no restriction is imposed by this example, since such structure is not relied upon.

Although in FIG. 6 circuit symbols for IGBTs of the depletion type are shown, this does not in any way restrict the methods or circuits or systems implemented according to the present disclosure. In particular, the power semiconductor devices PS1, PS2, PS3 may comprise IGBTs of the enhancement type or other transistors, thyristors or diodes. Also the power converter PC is only used as an example. In particular, it may be replaced with another power electronics device, for example a solid-state circuit breaker, a solid-state relay, a static VAR compensator or a switch-mode audio amplifier.

The power converter PC may for example comprise a drive and control unit DCU for driving and/or controlling the power semiconductor devices PS1, PS2, PS3.

The circuit C may be separate to the power converter PC as shown in FIG. 6. Alternatively, for example, the power converter PC or the drive and control unit DCU, may comprise the circuit C.

The circuit comprises a measuring unit MU for measuring the on-state voltage and current of at least one of the semiconductor devices PS1, PS2, PS3 in several repetitions within a predetermined time interval, and for communication with the power converter PC. The measuring unit MU may comprise for example one or more analogue to digital converters and/or a field-programmable gate array, FPGA. Alternatively, the measuring unit MU may comprise a micro-controller unit.

The circuit C further comprises a storage unit SU for storing the reference voltages and the reference currents. The SU is also for storing the adapted reference voltages, the validity factors as well as the average validity factors. Also, the equations, diagrams, or look-up tables for determining the validity factors might be stored in the SU.

In some implementations (not shown), the storage unit SU may be combined with the measuring unit MU, for example in the FPGA or micro-controller unit of the measuring unit MU.

The circuit C also comprises an evaluation unit EU, for example a microprocessor, for adapting the reference voltages, storing data to the storage unit SU and optionally for determining the estimate values for the junction temperature. In particular, the evaluation unit EU may be configured to perform all calculation steps described with respect to FIGS. 2 to 5. The evaluation unit EU may also be combined with the storage unit SU and/or the measuring unit MU.

By means of a method, a circuit or a system according to aspects of the present disclosure, an operation of a power semiconductor device may be analyzed at least up to its rated current and without calibration prior to use. This is achieved by effectively fitting the set of reference voltages to the measurement points using a least squares method, for example in the order of 100 ms or hundreds of ms. The least squares fit allows an adapted voltage to be calculated, which can be used to effectively perform a calibration online, that is during normal operation of the power semiconductor device or the system comprising the device, for example a power converter.

Aspects of the present disclosure allow for a better trade-off of accuracy versus computational load. If, for example simple binning would be used, then either a large number of current bins would be required, increasing the computational load when using the resulting data, or large errors would be present in the resulting voltages.

According to an aspect of the present disclosure, high-current measurements of on-state voltage drop may be used avoiding an interference with normal converter operation or requiring special low-current sources to be switched in and out.

Also complex look-up tables may be avoided.

The measurement error may be greatly reduced by the improved concept provided in the present disclosure, since a large set of data may be used.

Systems or circuits according to the improved concept provided in the present disclosure can cope with DC currents or very low frequency AC currents. In such cases only two reference currents will have valid data in a particular time-interval where the on-state current is approximately constant.

Implementations according to the improved concept provided in the present disclosure may involve junction temperature estimation, which may enable several features in next generation of "smart" power converters, including: dynamic rating control (intelligent over-rate/de-rate), optimized parallel inverter stack current sharing, condition monitoring (detection of wear-out and abnormal operation, giving predictive maintenance), temperature cycle counting and remaining useful life estimation, improved validation of inverter stack design during development and type testing, improved over-temperature detection.

Resulting benefits to manufacturers of power converters may include an optimized performance (for example current rating or efficiency) versus cost, for example through reduction of margins. Benefits to the end users of power converters may include the early detection of abnormal operation and potentially reduced operating costs.

In an analog way as described, the method may also be applied to other current-dependent TSEPs, including switching characteristics, such as peak diode reverse recovery current, peak overshoot voltage, and so forth. Also TSEPs being not universal for essentially all power semiconductor devices may be handled in an analogous way, for example a gate threshold voltage or an internal gate resistance. One key aspect is to remove the operating-point (for example current) dependency by converting a measurement with both operating point and temperature dependency into a discrete set of measurements with only temperature dependency.

Furthermore, the improved concept of the present disclosure may also be used to analyze an operation of electric equipment apart from power electronics, in particular when some kind of hot spot temperature of interest is difficult to measure because of a harsh environment. This may for example be the case for power transformers, where a hot spot temperature or a winding temperature of the transformer may be of interest.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS

PC power converter
DCU drive and control unit
PS1, PS2, PS3 power semiconductor devices
C circuit
EU evaluation unit
SU storage unit
MU measuring unit
Io on-state current
Vo on-state voltage
Tj junction temperature
V1, ... Vn, ... VN reference voltages, adapted reference voltages
In, ... In, ... IN reference currents
Imeas measured on-state current
Vmeas measures on-state voltage
MP measurement point
W1, ... Wn, ... WN validity factors
Wn(av), ... Wn(av), ... WN(av) average validity factors

The invention claimed is:

1. A method for analyzing an operation of a power semiconductor device, the method comprising:
providing a set of reference voltages of the device and a set of corresponding reference currents;
measuring, within a predetermined time-interval, Nframe on-state voltages and Nframe corresponding on-state currents of the device to obtain Nframe measurement points, wherein Nframe is an integer number equal to or greater than 2;
adapting the set of reference voltages by carrying out a least squares fit to the Nframe measurement points; and
using the adapted set of reference voltages to analyze the operation of the power semiconductor device,
wherein for the least squares fit, a piecewise-linear approximation between each two adjacent measurement points is assumed.

2. The method according to claim 1, wherein the analyzing comprises estimating a junction temperature of the device based on the adapted set of reference voltages.

3. A method for analyzing an operation of a power semiconductor device, the method comprising:
providing a set of reference voltages of the device and a set of corresponding reference currents;
measuring, within a predetermined time-interval, Nframe on-state voltages and Nframe corresponding on-state currents of the device to obtain Nframe measurement points, wherein Nframe is an integer number equal to or greater than 2;
adapting the set of reference voltages by carrying out a least squares fit to the Nframe measurement points; and
using the adapted set of reference voltages to analyze the operation of the power semiconductor device,
wherein the least squares fit comprises:
defining a validity factor for each of the reference currents, wherein the validity factors represent how near a measured on-state current is to each of the reference currents;
determining a set of validity factors for each of the measurement points resulting in Nframe sets of validity factors.

4. The method according to claim 3, wherein the validity factors are defined in such a way that a validity factor associated with a certain reference current equals 1 upon the measured on-state current equaling the reference current, while the validity factor associated with the reference current equals 0 upon the measured on-state current equaling an adjacent reference current.

5. The method according to claim 3, wherein for a measurement point within the predefined time-interval, the validity factors are defined by the following set of equations:

$$w_1(k) = 1 - \frac{I_{meas}(k) - I_1}{I_2 - I_1} \text{ for } I_1 \leq I_{meas}(k) \leq I_2, \text{ and}$$

$$w_1(k) = 0 \text{ for } I_{meas}(k) < I_1 \text{ and } I_{meas}(k) > I_2;$$

...

$$w_n(k) = \frac{I_{meas}(k) - I_{n-1}}{I_n - I_{n-1}} \text{ for } I_{n-1} \leq I_{meas}(k) \leq I_n,$$

$$w_n(k) = 1 - \frac{I_{meas}(k) - I_n}{I_{n+1} - I_n} \text{ for } I_n \leq I_{meas}(k) \leq I_{n+1}, \text{ and}$$

$$w_n(k) = 0 \text{ for } I_{meas}(k) < I_{n-1} \text{ and } I_{meas}(k) > I_{n+1};$$

...

$$w_N(k) = \frac{I_{meas}(k) - I_{N-1}}{I_N - I_{N-1}} \text{ for } I_{N-1} \leq I_{meas}(k) \leq I_N, \text{and}$$

$$w_N(k) = 0 \text{ for } I_{meas}(k) < I_{N-1} \text{ and } I_{meas}(k) > I_N.$$

6. The method according to claim 3, wherein the adapted set of reference voltages is determined based on the determined validity factors and the measured on-state voltages.

7. The method according to claim 6, wherein the adapted set of reference voltages is calculated by solving the equation:

$$\begin{bmatrix} V_{meas}(1) \\ \vdots \\ V_{meas}(N_{frame}) \end{bmatrix} = \begin{bmatrix} w_1(1) & \cdots & w_N(1) \\ \vdots & \ddots & \vdots \\ w_1(N_{frame}) & \cdots & w_N(N_{frame}) \end{bmatrix} \begin{bmatrix} V_1 \\ \vdots \\ V_N \end{bmatrix}, \text{ i.e.:}$$

$$\underline{V}_{meas} = W\underline{V},$$

for the vector V.

8. The method according to claim 3, wherein the step of estimating the junction temperature comprises determining a set of average validity factors based on the Nframe sets of validity factors and estimating the junction temperature based on the set of average validity factors.

9. The method according to claim 8, wherein the determining of the set of average validity factors comprises determining respective time averages over corresponding validity factors of the Nframe sets of validity factors, by the following equation:

$$w_{n(av)} = \frac{1}{N_{frame}} \sum_{k=1}^{N_{frame}} w_n(k).$$

10. The method according to claim 8, wherein the step of estimating the junction temperature comprises calculating an estimated value for the junction temperature based on an assumed linear relation between the estimated value for the junction temperature and one of the adapted set of reference voltages.

11. The method according to claim 8, wherein the step of estimating the junction temperature comprises:
 calculating a plurality of estimated values for the junction temperature based on respective assumed linear relations between each estimated value for the junction temperature and a respective one of the adapted set of reference voltages;
 weighting each of the plurality of estimated junction temperatures according to a respective average validity of the set of average validities.

12. A circuit for analyzing an operation of a power semiconductor device, the circuit comprising:
 a measuring unit configured to measure within a predetermined time-interval Nframe on-state voltages and Nframe corresponding on-state currents of the device to obtain Nframe measurement points, wherein Nframe is an integer number equal to or greater than 2;
 a storage unit configured to store a set of reference voltages of the device and a set of corresponding reference currents of the device; and
 an evaluation unit configured to:
  adapt the set of reference voltages by carrying out a least squares fit to the Nframe measurement points; and
  analyze the operation of the power semiconductor device based on the adapted set of reference voltages,
 wherein for the least squares fit, a piecewise-linear approximation between each two adjacent measurement points is assumed.

13. The power electronic system comprising the circuit according to claim 12 and the power semiconductor device.

14. The power electronic system according to claim 13 comprising a power converter, the power converter comprising the power semiconductor device.

* * * * *